US006844782B2

(12) United States Patent
Otaka

(10) Patent No.: US 6,844,782 B2
(45) Date of Patent: Jan. 18, 2005

(54) TEMPERATURE COMPENSATION CIRCUIT AND A VARIABLE GAIN AMPLIFICATION CIRCUIT

(75) Inventor: Shoji Otaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 09/985,595

(22) Filed: Nov. 5, 2001

(65) Prior Publication Data

US 2002/0084850 A1 Jul. 4, 2002

(30) Foreign Application Priority Data

Nov. 6, 2000 (JP) ........................................ 2000-337175

(51) Int. Cl.⁷ ............................................... H03F 3/45
(52) U.S. Cl. ..................................... 330/254; 330/256
(58) Field of Search ................................ 330/254, 256; 327/359; 455/234.1

(56) References Cited

U.S. PATENT DOCUMENTS

| 5,708,420 A | * | 1/1998 | Drouot ........................ 340/660 |
| 6,028,478 A | * | 2/2000 | Seremeta et al. ........... 330/252 |
| 6,215,989 B1 | | 4/2001 | Otaka | |

FOREIGN PATENT DOCUMENTS

JP 2002 141753 * 5/2002

OTHER PUBLICATIONS

Riihihuhta et al. "A High Dynamic Range No MHz AGC–Amplifier With Linear and Temperature Compensatal Gain Control".*

1994 IEEE International Symposium on Circuits and Systems, London, May 30, 1994 to Jun. 2, 1994 pp 521–524.*

Yamaji et al. "A Temperature–Stable CMOS Variable–Gain Amplifier With 80–dB Linearly Controlled Gain Range" IEEE Journal of Solid–State Circuits, vol. 37 Issue 5 May 2002 pp 553–558.*

Shoji Otaka, et al. "A Low–Power Low–Noise Accurate Linear–in–dB Variable–Gain Amplifier with 500–MHz Bandwidth", IEEE Journal of Solid–State Circuits. vol. 35. No. 12. Dec. 2000, pp. 1942–1948.

* cited by examiner

Primary Examiner—Michael B. Shingleton
(74) Attorney, Agent, or Firm—Oblon, Spivak, McClelland, Maier & Neustadt, P.C.

(57) ABSTRACT

A temperature compensation circuit comprises a signal source to output a first signal corresponding to a temperature change of an ambient temperature to a predetermined temperature, and a multiplier to multiply an external gain control signal and the first signal and output a second signal proportional to the temperature change and the first signal to a variable gain amplifier to perform the temperature compensation with respect to the variable gain amplifier.

19 Claims, 5 Drawing Sheets

$ICNT0 = g_2 \cdot V_c = C \cdot I_c$

TEMPERATURE COMPENSATION CIRCUIT AND A VARIABLE GAIN AMPLIFICATION CIRCUIT

CROSS-REFERENCE TO RELATED APPLICATIONS

This application is based upon and claims the benefit of priority from the prior Japanese Patent Application No. 2000-337175, filed Nov. 6, 2000, the entire contents of which are incorporated herein by reference.

BACKGROUND OF THE INVENTION

1. Field of the Invention

The present invention relates to a temperature compensation circuit performing a temperature compensation with respect to a gain characteristic of a variable gain amplifier fabricated by MOS transistors and gain-controlled by an external gain control signal, and a variable gain amplification circuit using the same temperature compensation circuit.

2. Description of the Related Art

In a conventional art, a variable gain amplifier has been developed so that a gain varies with an exponential function in respect to a gain control signal Vc. For example, U.S. Pat. No. 6,215,989 B1, the entire contents of which are incorporated herein by reference, a variable gain amplifier fabricated by bipolar transistors having an input/output characteristic representing an exponential function.

In late years, a variable gain amplifier using MOS transistors which is beneficial to cost reduction is developed. However, since the MOS transistor has an input/output characteristic of square-law characteristic, a circuit must be improved to obtain an exponential function characteristic.

The applicant provides a technique of realizing a variable gain amplifier utilizing a fact that the MOS transistor operating in a weak inversion region has an exponential-law characteristic expressed by an expression (4) (refer to the U.S. patent application Ser. No. 09/950,630, the entire contents of which are incorporated herein by reference).

However, since a thermal voltage W(=k/T/q) of the equation (4) is a variable proportional to the temperature T, a gain varies by the temperature as shown in FIG. 10. Therefore, this temperature variation must be suppressed.

BRIEF SUMMARY OF THE INVENTION

It is an object of the invention to suppress a temperature variation of a gain characteristic of a variable gain amplifier using a MOS transistor.

According to an aspect of the present invention, there is provided a temperature compensation circuit performing a temperature compensation with respect to a gain characteristic of a variable gain amplifier fabricated by MOS transistors and gain-controlled by an external gain control signal, the apparatus comprising: a signal source configured to output a first signal corresponding to a temperature change of an ambient temperature to a predetermined temperature; a multiplier configured to multiply the external gain control signal and the first signal and output a second signal proportional to the temperature change and the first signal; and a temperature compensation device configured to transfer the second signal to the variable gain amplifier to perform the temperature compensation with respect to the variable gain amplifier.

DETAILED DESCRIPTION OF THE INVENTION

The present invention realizes a variable gain amplifier circuit using MOS transistors operable in a weak inversion region. It is generally known that an input/output characteristic shifts from a square-law characteristic to an exponential-law characteristic when a density of current flowing through a MOS transistor is decreased. The region where a MOS transistor has the exponential-law characteristics is referred to as a weak inversion region.

In contrast, a region having a square-law characteristic is referred to as a strong inversion region, and a gate-to-source voltage when it is changed from the weak inversion region to the strong inversion region is referred to as a threshold voltage. In other words, at the time of VGS≧VTH (VGS: gate-to-source voltage, VTH: threshold voltage), the MOS transistor becomes a strong inversion state, and at the time of VTH/2<VGS<VTH, the MOS transistor becomes a weak inversion state. According to this technique, since a characteristic of MOS transistor in itself is used, a circuit does not become complicated, and low power consumption can be realized.

In weak inversion region, a $I_D$-$V_{GS}$ characteristic (input/output characteristic) is expressed by $$I_D = I_{ON} \cdot \exp\left(\frac{V_{GS} - V_{ON}}{n \cdot V_T}\right) \qquad (1)$$

where ID is a drain current, $I_{ON}$ is an ON current, and $V_{ON}$ is an ON voltage, and $I_{ON}$, $V_{ON}$ and n are constants determined by a production process of a MOS transistor (for example, doping density of impurities). VT=(k·T)/q, where VT: thermal voltage, a k: Boltzmann constant, T: temperature, and q: elementary charge quantity.

Figure 7:
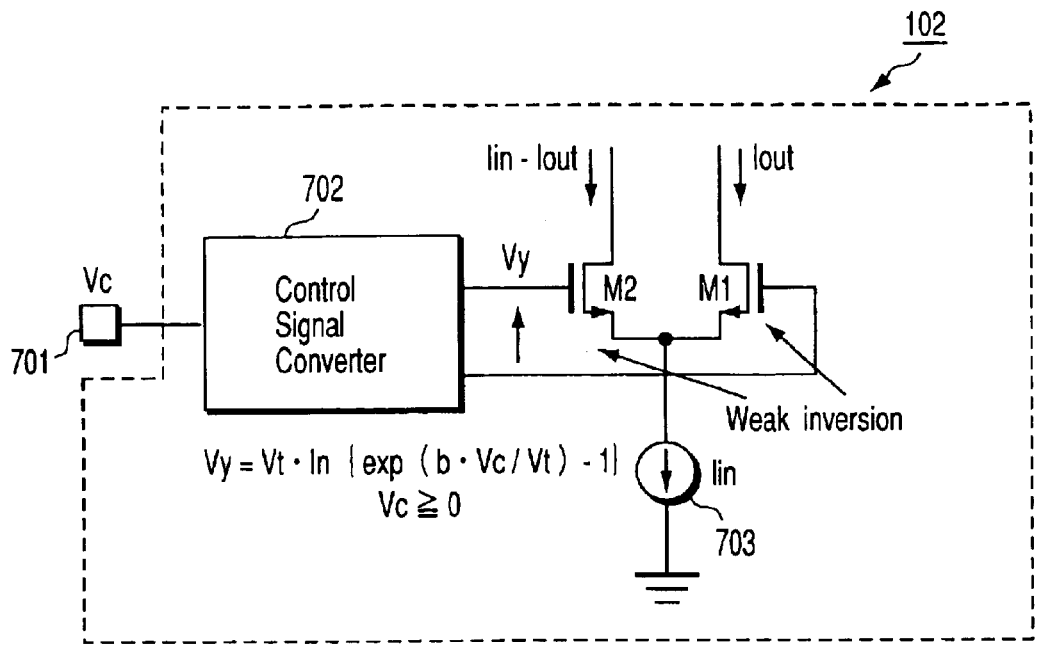
FIG. 7 shows a block diagram of a variable gain amplifier 102 utilizing a weak inversion region of a MOS transistor.
Figure 8:
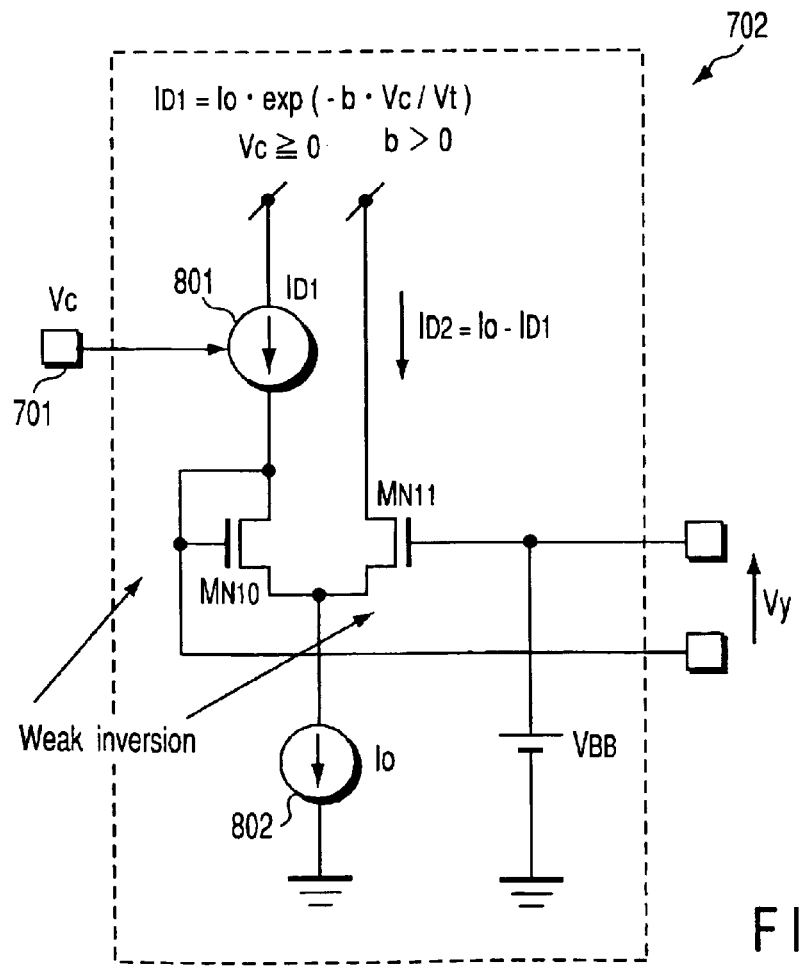
FIG. 8 shows a concrete circuit diagram of a control signal converter 702 of FIG. 7 that utilizes a weak inversion region of a MOS transistor.

The gain control signal (first gain control signal) Vc can be exponentially gain-controlled when a variable gain amplifier 102 shown in FIGS. 7 and 8 is operated in the weak inversion region. A gain characteristic of an output current to an input current is expressed by an expression (2) with respect to the second gain control signal Vy, and the transfer function of gain control signal converter 702 is expressed by an equation (3). A concrete circuit configuration of a current source 801 of FIG. 8 refers to FIG. 9, and a gain control signal current 1c flowing through a current source 901 of FIG. 9 indicates the current proportional to a gain control signal Vc.

$$\frac{I_{out}}{I_{in}} = \frac{1}{1 + \exp\left(\frac{V_y}{n \cdot V_T}\right)} \quad (2)$$

$$V_y = n \cdot V_T \cdot l_n\left\{\exp\left(\frac{b \cdot V_c}{n \cdot V_T}\right) - 1\right\} \quad (3)$$

where b indicates a proportional constant. When the equation (3) is inserted in the equation (2), an equation (4) showing an exponential gain control is obtained.

$$\frac{I_{out}}{I_{in}} = \frac{1}{1 + \exp\left(\frac{V_y}{n \cdot V_T}\right)} \quad (4)$$

$$= \exp\left(\frac{-b \cdot V_c}{n \cdot V_T}\right)$$

Figure 10:
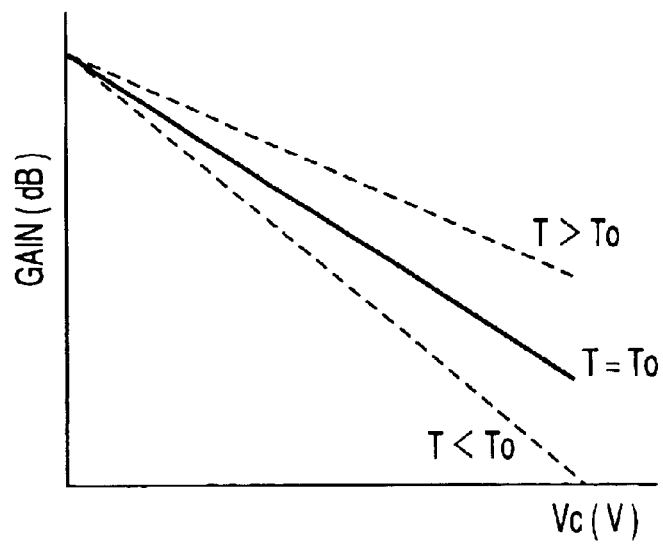
FIG. 10 shows a graph to show a temperature characteristic of the gain control without temperature compensation in a variable gain amplifier 102 utilizing a weak inversion region of a MOS transistor of FIG. 7.

However, since a thermal voltage VT(=(k·T)/q) of the equation (4) is a variable proportional to the temperature T, a gain varies by the temperature as shown in FIG. 10. Therefore, this temperature variation must be suppressed. The present invention is directed to temperature compensation of a gain of the variable gain amplifier circuit.

There will now be described embodiments according to the invention in conjunction with drawings.

If the thermal voltage VT of the equation (4) is represented as a thermal voltage VTo with a predetermined temperature To, and a temperature change of an ambient temperature T to a predetermined temperature To, for example, a difference is indicated by ΔT, VT is expressed with VTo (1+ΔT/To), and the equation (4) is converted to an equation (5).

$$\frac{I_{out}}{I_{in}} = \exp\left\{\frac{-b \cdot V_c}{n \cdot V_{To}\left(1 + \frac{\Delta V}{T_o}\right)}\right\} \quad (5)$$

If a temperature dependency is utilized in order to convert Vc into Vc (1+ΔT/To), the equation (5) is converted to an equation (6).

$$\frac{I_{out}}{I_{in}} = \exp\left\{\frac{-b \cdot V_c\left(1 + \frac{\Delta V}{T_o}\right)}{n \cdot V_{To}\left(1 + \frac{\Delta V}{T_o}\right)}\right\} \quad (6)$$

$$= \exp\left(\frac{-b \cdot V_c}{n \cdot V_{To}}\right)$$

The equation (6) is the equation having no temperature dependency. It can be understood to convert a gain control signal Vc into a signal represented by Vc (1+ΔT/To) to avoid a temperature dependency of a gain characteristic of an output current $I_{out}$ to an input current $I_{in}$.

First Embodiment

Figure 1A:
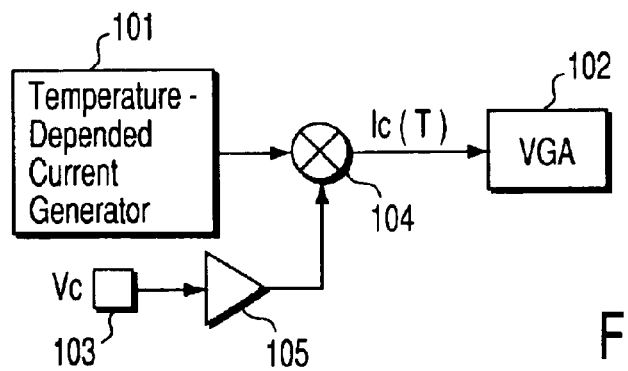
FIGS. 1A and 1B show block diagrams of variable gain amplification circuits performing a temperature compensation with respect to a gain of a variable gain amplifier according to an embodiment of the present invention.

FIG. 1A shows a block diagram expressing a first basic concept of a variable gain amplification circuit performing a temperature compensation with respect to a gain of a variable gain amplifier according to an embodiment of the present invention. In order to generate a gain control signal current 1c (T)=Ic (ΔT)=g1* Vc (1+ΔT/To) (g1: conductance (A/V)) to be given to the variable gain amplifier (VGA) 102, the temperature variable (1+ΔT/To) of the output signal of the current source having a temperature dependency is multiplied with the gain control signal current Ic.

In the present invention, the output current 1c(ΔT) as the multiplication result is used as a gain control signal of the variable gain amplifier. A gain control signal input terminal 103 is a terminal to receive a gain control signal Vc supplied from the outside. An amplifier 105 has a function as a voltage –current converter that converts the gain control signal Vc to the gain control signal current 1c in addition to a function as an amplifier.

Figure 1B:
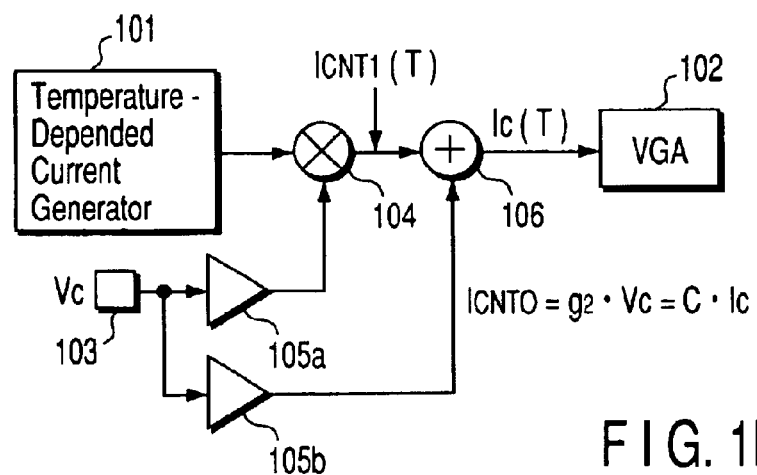

FIG. 1B shows a block diagram illustrating a second basic concept of a variable gain amplification circuit performing a temperature compensation with respect to a gain of a variable gain amplifier according to an embodiment of the present invention. FIG. 1B differs from FIG. 1A in generation of an output signal by adding a gain control signal $I_{CNT0}$ (=g2*Vc=c*Ic) (g2: conductance (A/V), c: coefficient) which substantially does not depend upon a temperature and a gain control signal $I_{CNT1}$ depending upon a temperature (T). In this case, the signal $I_{CNT1}$ (T) makes it possible to change a proportional coefficient of temperature into a desired value from 1/To. The gain control signal $I_{CNT0}$ that does not depend upon a temperature substantially can be generated by a conventional differential amplifier 105b using a source degenerate resistor.

Figure 2:
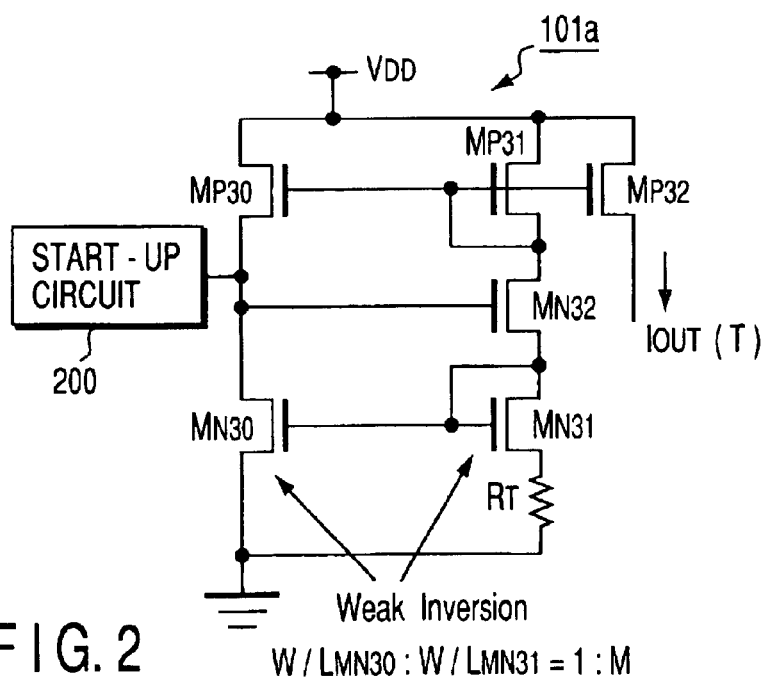
FIG. 2 shows a circuit diagram of a current source 101$a$ having a temperature dependency.

The current source used for making the gain control signal Vc have a temperature dependency is explained hereinafter. FIG. 2 is a circuit diagram showing a concrete circuit 101a of the current source 101 having a temperature dependency as shown in FIGS. 1A and 1B. A reference "M" shows a MOS (Metal Oxide Semiconductor) transistor, and a subscript "P" indicates a P type and a subscript "N" indicates an N type. The circuit of current source 101a is known broadly as a Widlar current source. (reference: P. R. Gray and R. G. Meyer, "Analysis and Design of ANALOG INTEGRATED CIRCUITS, 3rd edition", WILEY.) However, the conventional Widlar current source is fabricated by bipolar transistors.

In the current source 101a related to the embodiment, MOS transistors are used for integrating the current source, and MOS transistors MN 30 and MN31 are operated in weak inversion regions to output a current with a temperature dependency. In other words, the current source 101a comprises a MOS transistor MN30 having a source terminal connected to a ground terminal and a MOS transistor MN31 having a source terminal connected to the ground terminal via a resistor RT. The gate terminal of the MOS transistor MN30 is connected to the gate and drain terminals of the MOS transistor MN31. Substantial equal currents flow through the drain terminals of the MOS transistor MN30 and MN31. The MOS transistors MN30 and MN31 are operated in the weak inversion region.

The circuit configuration of the current source 101a will be described hereinafter. The transistors MN30 and MN31 operate as a current mirror circuit, and the gate terminal and drain terminal of the transistor MP31 construct the input terminal of the current mirror circuit. The drain terminal of the transistor MN30 is connected to the output terminal of the current mirror circuit, the source terminal thereof is grounded, and the gate terminal thereof is connected to the gate and drain terminals of the transistor MN31. The source terminal of the transistor MN31 is grounded via a resistor RT. The drain terminal of the transistor MN32 is connected to the input terminal of the current mirror circuit, and the source terminal thereof is connected to the drain terminal of the transistor MN31, and the gate terminal thereof is connected to the drain terminal of the transistor MN30 and a start up circuit 200. This current source 101a has two stable points of a current value, and the start up circuit 200 is provided for making the current source active to obtain a predetermined current value. The W/L ratio (W: gate width, L: gate length) of the transistors MN30 and MN31 is set at 1:M. The transistors MN30 and MN31 are designed to increase W for the purpose of reducing a current density so that they operate in the weak inversion region.

The operation of the current source 101a is explained hereinafter. The input/output characteristic of the transistors MN30 and MN31 is expressed with the equation (1) to operate the transistor MN30 and MN31 in the weak inversion region. Therefore, the voltage VR applied to both ends of the resistor RT is expressed with the following equations.

$$V_R = V_{GS,MN30} - V_{GS,MN31} \quad (7)$$
$$= n \cdot V_T \cdot \ln M$$

Therefore, the operating current $I_{out}(T)$ is expressed with an equation (8).

$$I_{out}(T) = \frac{V_R}{R_T} \quad (8)$$
$$= \frac{n \cdot V_T \cdot \ln M}{R_T}$$
$$= \left(\frac{n \cdot \ln M}{R_T}\right) V_{To} \left(1 + \frac{\Delta T}{T_o}\right)$$
$$= I_o \left(1 + \frac{\Delta T}{T_o}\right)$$

where Io=(n*lnM/RT) VTo. Therefore, it is understood that the current source 101a has a temperature dependency.

Figure 3:
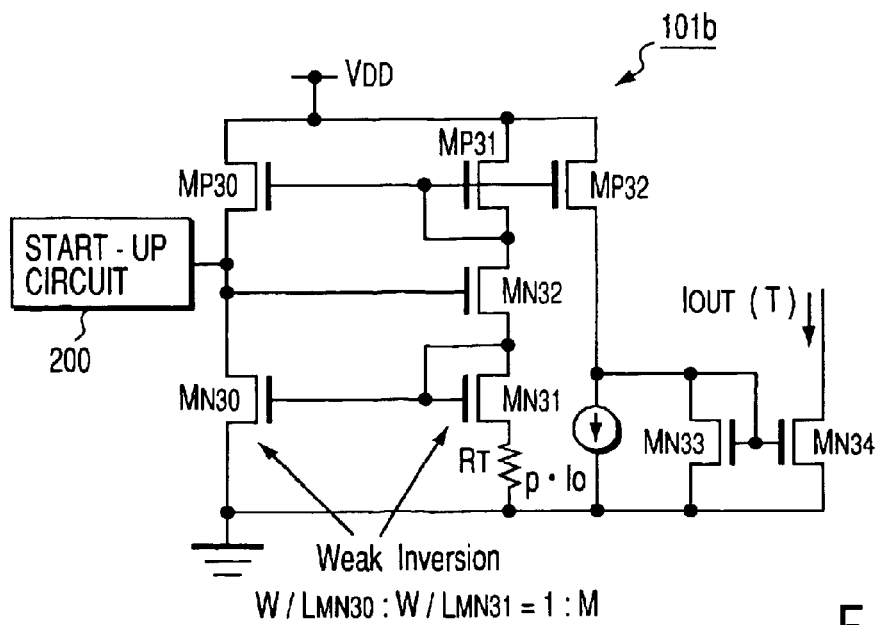
FIG. 3 is a circuit diagram of a current source 101$b$ which is a modification of the current source 101$a$ having a temperature dependency.

FIG. 3 shows a concrete circuit 101b of the current source 101 of FIGS. 1A and 1B having a temperature dependency. In FIG. 3, the temperature coefficient is set to a value different from 1/To. The circuit of FIG. 3 differs from that of FIG. 2 in inputting an output of the transistor MP32 and an output of a constant current source P*Io (P indicates an adjustable coefficient) without a temperature dependency to a current mirror circuit fabricated by transistors MN33 and MN34, and extracting an output current $I_{out}(T)$ from transistor MN34 of the current mirror circuit.

According to the above configuration, the output current Iout (T) is expressed with the following equations.

$$I_{out}(T) = I_o\left(1 + \frac{\Delta T}{T_o}\right) - p \cdot I_o \quad (9)$$
$$= (1-p)I_o\left\{1 + \frac{\Delta T}{T_o(1-p)}\right\}$$

An equation (10) is provided when the current is multiplied by 1/(1−p).

$$I_{out}(T) = I_o\left\{1 + \frac{\Delta T}{T_o(1-p)}\right\} \quad (10)$$

The temperature coefficient can be changed by selecting P properly.

Figure 4:
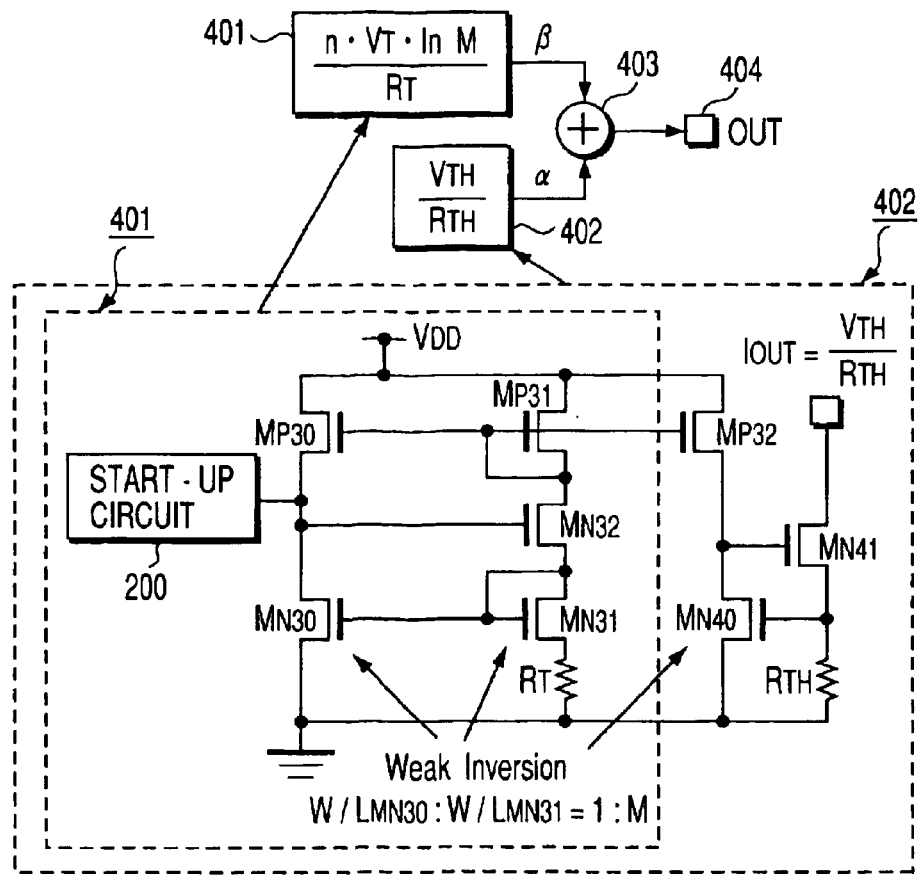
FIG. 4 shows a circuit diagram of a current source having no temperature dependency.

FIG. 4 shows a circuit of a current source having substantially no temperature dependency, and this current source is used as a current source 501 of FIG. 5 having no temperature dependency as described below. This circuit uses that the polarity of a temperature dependency of thermal voltage $V_T$ and that of a temperature dependency of the threshold voltage $V_{TH}$ of a MOS transistor is different. In other word, results obtained by multiplying desired coefficients (α, β) by respective current outputs are added by an adder 403. The addition result is output as the current having substantially no temperature dependency to an output terminal 404. A circuit 401 corresponds to the current source 101a of FIG. 2. The current source is proportional to the thermal voltage $V_T$ and has a temperature dependency. A circuit 402 comprises a current source proportional to the threshold voltage $V_{TH}$ and having a temperature dependency. In other words, the current source comprises a MOS transistor $M_{N40}$ whose source terminal is grounded, a resistor $R_{TH}$ through which a gate terminal of the MOS transistor $M_{N40}$ is grounded, and a MOS transistor $M_{N41}$ having a gate terminal connected to a drain terminal of the MOS transistor $M_{N40}$ and a source grounded via the resistor $R_{TH}$. The drain terminal of the MOS transistor $M_{N41}$ is connected to an output terminal.

When the transistor MN40 is operated in the weak inversion region, $V_{GS}$ can be approximated to the threshold voltage Therefore, an output current of the circuit 402 is expressed by an equation (11).

$$I_{out}(T) = \frac{V_{TH}}{R_{TH}} \quad (11)$$
$$= \frac{V_{THo}(1 - q \cdot \Delta T)}{R_{TH}}$$

where $V_{THo}$ expresses a threshold voltage of predetermined temperature To, q expresses a temperature coefficient of a threshold voltage and $R_{TH}$ expresses a resistor. The circuit 402 comprises a current source having a threshold voltage as a reference, and is referred to as a threshold reference circuit.

In this circuit, the current flowing through the transistor MN40 is based on a current depended upon the thermal voltage $V_T$. However, $V_{GS}$ can be approximated to the threshold voltage if the transistor MN40 is not operated in the weak inversion region as described above. Therefore, no problem occurs even if a bias is set using the current depended upon $V_T$. Even if the transistor MN40 is used in the weak inversion region, the temperature dependency of the threshold voltage can be anticipated. Therefore, there is a case that the transistor MN40 need not be used always in the weak inversion region.

Figure 5:
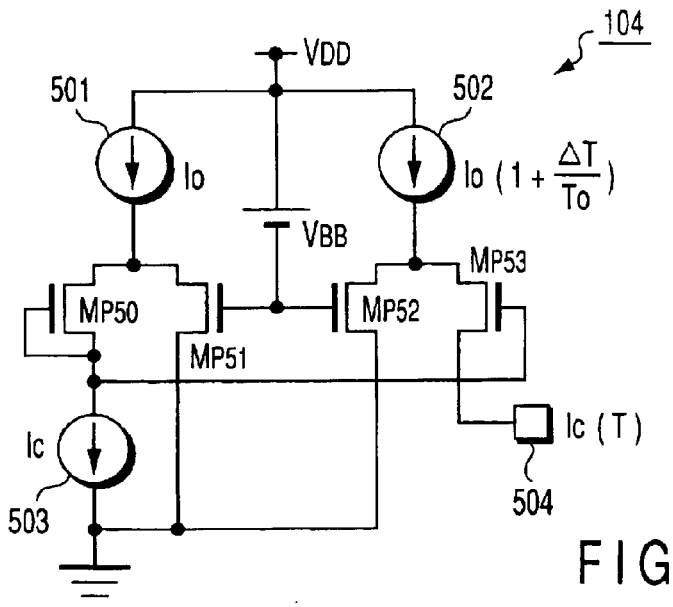
FIG. 5 is a circuit diagram of a multiplier used for realizing a variable gain amplifier using MOS transistors and having no temperature dependency.

FIG. 5 shows a multiplier 104 to generate a current having a temperature dependency and a gain control current 1c. The multiplier 104 comprises current sources 501, 502 and 503 and MOS transistors $M_{P50}$, $M_{P51}$, $M_{P52}$ and $M_{P53}$. The current source 501 is connected to a node of drain terminals of the MOS transistors $M_{P50}$ and $M_{P51}$ and the current source 502 is connected to a node of drain terminals of the MOS transistors $M_{P52}$ and $M_{P53}$. The gate of the MOS transistors $M_{P51}$ and $M_{P52}$ is connected to a voltage source $V_{BB}$. The gate and source terminals of the MOS transistor $M_{P50}$ and the gate terminal of the MOS transistor $M_{P53}$ is grounded via the current source 503. The source terminals of the MOS transistors $M_{P51}$ and $M_{P52}$ are grounded. The source terminal of the MOS transistor $M_{P53}$ is connected to the output terminal 504.

The multiplier 104 makes a gate-to-gate voltage common to two differential transistor pairs $M_{P50}$, $M_{P51}$ and $M_{P52}$, $M_{P53}$. Therefore, the ratio between the tail current Io and gain control current Ic can be substantially equalized to the ratio between the tail current Io $(1+\Delta T/To)$ and output current Ic (T). The tail current Io is output by a current source 501 and a current having substantially no temperature dependency, and the gain control current Ic is a gain control current before the temperature compensation that is output by a current source 503. The tail current Io $(1+\Delta T/To)$ is a current with a temperature dependency output from the current source 502, and the output current Ic (T) is a current obtained at an output terminal 504. As a result, the output current 1c (T) is determined by multiplication of a temperature variable $(1+\Delta T/To)$ of the tail current 1o $(1+\Delta T/To)$ having the temperature dependency with the gain control current 1c before temperature compensation. Then it is expressed this with the following equations.

$$\frac{I_c}{I_o} = \frac{I_c(T)}{I_o\left(1+\frac{\Delta T}{T_o}\right)} \quad (12)$$

$$I_c(T) = I_c\left(1+\frac{\Delta T}{T_o}\right) \quad (13)$$

This equation is an equation when transistors MP50, MN51, MP52 and MP53 are operated in the weak inversion region, that is, when the transistors MP50, MN51, MP52 and MP53 had an exponential input/output characteristic. However, this equation can be applied in approximation even where the transistor MP50, MN51, MN52 and MP53 had a square-law input/output characteristic.

In the above explanation, the current source with the temperature coefficient of 1/To is applied, but it can be substituted for a current source with temperature coefficient different from 1/To as shown in FIG. 3.

The above embodiment is described for the temperature compensation of FIG. 1A, but is applicable to the temperature compensation of FIG. 1B. The multiplication of the gain control current signal Vc with the current of the current source 101 having a temperature dependency can be performed by a multiplier 104 shown in FIG. 5. A current source having a temperature dependency uses the current source of FIG. 2 or the current source of FIG. 3. In this case, the control current subjected to a temperature compensation is $I_{CNT1}$ (T) of FIG. 1B. The circuit for gain control current having substantially no temperature dependency may use a conventional differential amplifier 105b. Therefore, detailed description of the circuit is omitted.

Figure 9:
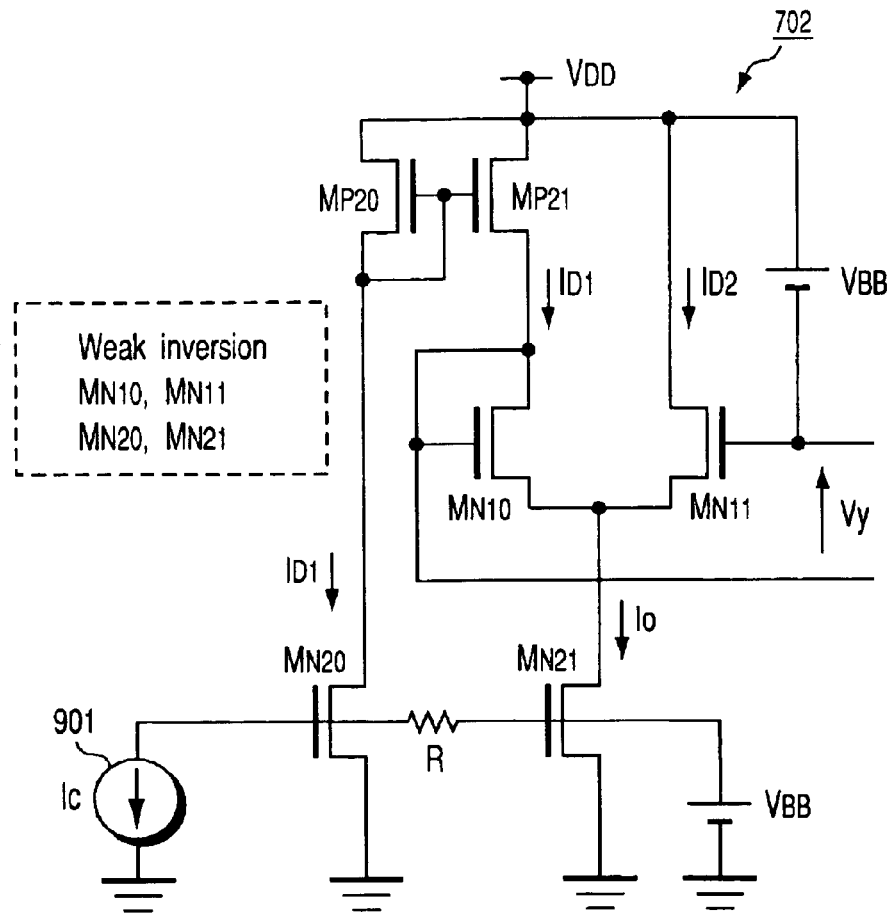
FIG. 9 shows a circuit diagram of a control signal converter 702 including a concrete circuit of a current source 801 of FIG. 8.

In a case of FIG. 1A, the gain control current Ic (T) having a temperature dependency is generated according to the equation (12), and is input to the current source 901 shown in FIG. 9. In a case of FIG. 1B, the gain control current Ic(T) having a temperature dependency is generated by adding the current $I_{CNTO}$ having substantially no temperature dependency to the current $I_{CNT1}$ (T) having a temperature dependency, and then input to a current source 901 shown in FIG. 9. A gain equation used for a variable gain circuit using FET that an applicant provides in prior application specification (refer to the U.S. patent application Ser. No. 09/696,972, the entire contents of which are incorporated herein by reference) is expressed with the following equation (14).

$$G_{MOS} = \sqrt{\exp(-d \cdot V_c)} \quad (14)$$

where d expresses a constant. The equation (14) is not a function of VT because it is supposed that the current ID1 of a circuit as shown in FIG. 8 is Io*exp(-d*Vc) in the U.S. patent application Ser. No. 09/696,972, the entire contents of which are incorporated herein by reference. However, when the current ID is generated by a circuit as shown in FIG. 9, the gain is expressed with the following equation (15) and is a function of $V_T$.

$$G_{MOS} = \sqrt{\exp\left(\frac{-d_1 \cdot V_c}{n \cdot V_T}\right)} \quad (15)$$

$$= \exp\left(\frac{-d_1 \cdot V_c}{2n \cdot V_T}\right)$$

where d1 expresses a constant. Therefore, the present invention can be applied to a variable gain amplifier of the variable gain circuit having FET which is disclosed in the Japanese Patent Application No. 11-306798.

In other words, the temperature compensation can be performed by multiplying an exponent of an equation (15) by a variable k (T) depending upon a temperature. (Explanation of FIGS. 7, 8 and 9

FIG. 7 shows a variable gain amplifier 102 utilizing a weak inversion region of a MOS transistor. A gain control signal (first gain control signal) Vc for controlling a gain of the variable gain amplifier 102 from the outside is input to the gain control signal input terminal 701. The first gain control signal Vc is converted to a second gain control signal Vy by a control signal converter 702, and then is supplied to a variable gain amplifier fabricated by first differential transistor pair (M1, M2).

The variable gain amplifier is a circuit whose gain is controlled by the second gain control signal Vy, and comprises a first differential transistor pair of N type MOS transistors M1 and M2 which are operated in the weak inversion region. A common source terminal of the transistors M1, M2 is connected to a current source 703. An input signal current $I_{in}$ to be amplified is supplied from the current source 703 to the differential transistor pair and an output terminal $I_{out}$ is taken out from the drain terminal of the transistor M1. The current $I_{in}-I_{out}$ flowing through the drain terminal of the transistor M2 is an unnecessary current, and flows to a power supply and so on. The second gain control signal Vy output by control signal conversion 702 is a voltage signal, and input between the gate terminals of the transistor M1 and M2 constructing a differential transistor pair.

FIG. 8 shows a concrete circuit of gain control signal converter 702 of FIG. 7. This gain control signal converter 702 has a second differential transistor pair of N type MOS transistors MN10 and MN11 that operate in the weak inversion region, and a current source 802 is connected to a common terminal of the transistors MN10 and MN11. A direct current Io is input to the second differential transistor pair by the current source 802. The drain and gate terminals of the transistor MN10 are connected to each other and a current ID1=Io*exp (-b*Vc/VT) is input into the drain terminal. The gate terminal of the transistor MN11 is applied with a constant direct current level by a power supply $V_{BB}$ and the drain terminal of the transistor MN11 is connected to a power supply $V_{DD}$ (not shown), for example.

The current source 801 for generating a current ID1 to be supplied to the gain control signal converter 702 of FIG. 8 is described in conjunction with FIG. 9. In FIG. 9, N type MOS transistors MN20 and MN21 operate in the weak inversion region similarly to the transistors MN10 and MN11.

There will now be described only about a point to be different from FIG. 8 hereinafter. The current Io of the current source 802 of FIG. 8 is generated by the voltage source $V_{BB}$ and transistor MN21 of FIG. 9. The gate terminal of the transistor MN21 is connected to the voltage source $V_{BB}$ and also to the gate terminal of the transistor MN20 and a gain controlled current source 901 (Ic=u/Vc) via a resistor R. Ic expresses a current proportional to the voltage of the second gain control signal Vc (a proportion coefficient is u). Since the current IC is generated in easy using a voltage-to-current converter such as a differential circuit wherein a source degenerate resistor is connected between source terminals, the detail description is omitted.

The source of the transistor MN20 is grounded, and its drain terminal is connected to an input terminal of a current mirror circuit fabricated by transistors MN20 and MP21 (gate and drain terminals of the transistor MP20). The drain terminal of the transistor MP21 which is an output terminal of the current mirror circuit is connected to the drain and gate terminals of the transistor MN10. The current 1D1= Io*exp(-b*Vc/VT) of the current source 801 of FIG. 8 is generated by a part of a circuit of FIG. 9. When a variable gain amplifier is fabricated using the circuit of FIG. 7, the ratio of an input current to an output current represents an exponential-law characteristic as is indicated in the equation (4).

Second Embodiment

Figure 6:
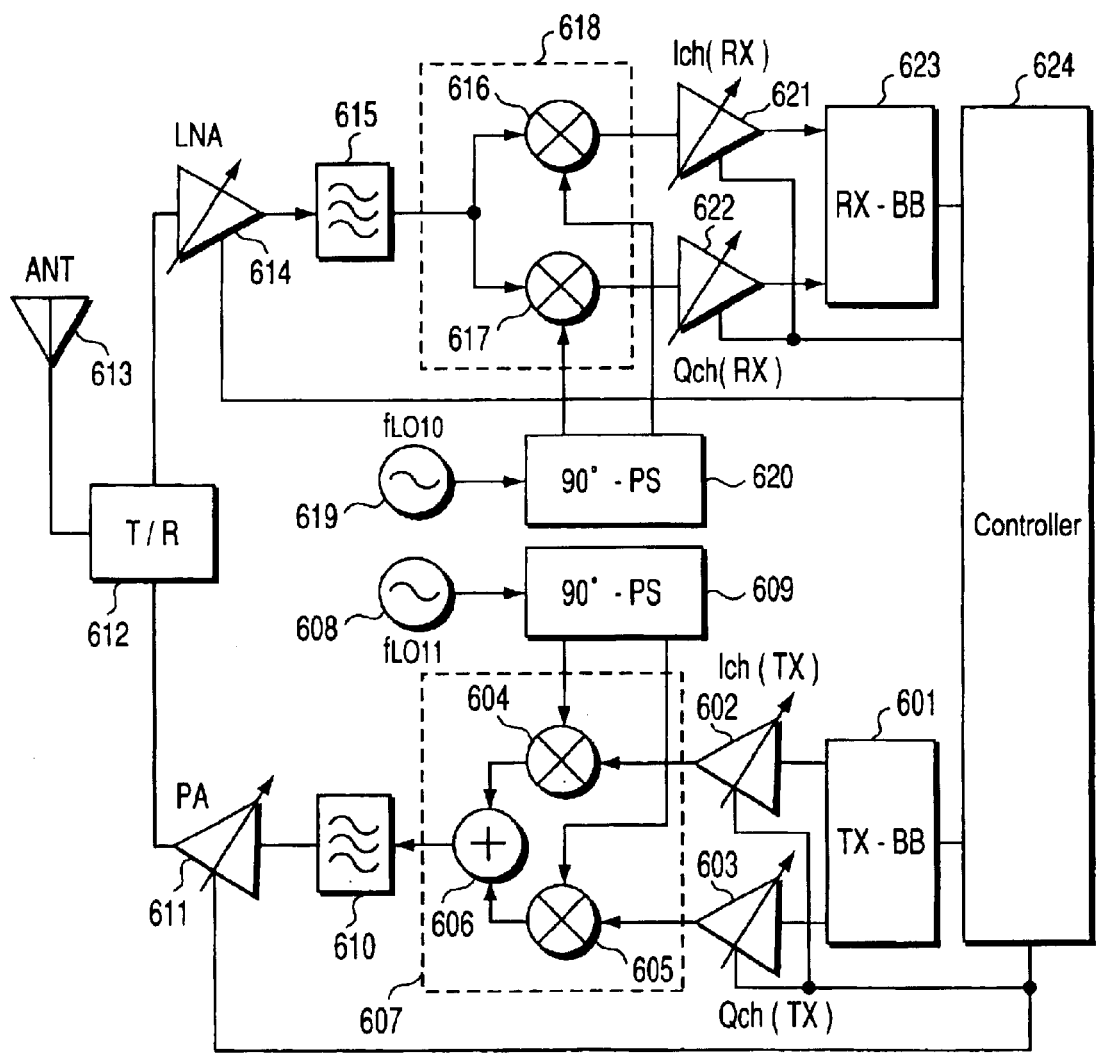
FIG. 6 shows a direct conversion type radio apparatus.

A variable gain amplification circuit related to an embodiment of the present invention is suitable for a radio communication apparatus of portable communication equipment using a direct conversion system. FIG. 6 shows a configuration of a transceiver of a radio communication apparatus of the direct conversion system. The present embodiment is described based on a TDD (Time Division Duplex) system for performing a change of transmission and reception by time sharing, but the present embodiment is not limited to this system.

On a transmitter side, the first and the second transmission baseband signals Ich (TX) and Qch (TX) orthogonal to each other are band-limited by a suitable filter in a baseband signal generator (TX-BB) 601. These orthogonal baseband signals Ich (TX) and Qch (TX) are amplified, respectively, by baseband signal amplifiers 602 and 603 each comprising a variable gain amplifier related to the present embodiment. Then, the orthogonal transmission baseband signals Ich (TX) and Qch (TX) are input to an orthogonal modulator 607 comprising multipliers 604 and 605 and an adder 606.

The orthogonal modulator 607 modulates, with the baseband signals Ich (TX) and Qch (TX), two orthogonal local oscillation signals generated by dividing a local oscillation signal (frequency fLO11) of a local oscillator 608 by a 90° phase shifter (90°–PS) 609. An unnecessary component is removed from a modulated signal output from the orthogonal modulator 607 (a RF (radio) signal) by a band passage filter 610 and input to an power amplifier (PA) 611. In power amplifier 611, the RF signal is adjusted to a suitable signal level by a RF stage variable gain amplifier provided on an input stage based on a control signal from a controller 624 and then is amplified to a predetermined power level.

The controller 624 is so constructed as to generate a control signal corresponding to a predetermined transmission power and a received signal power. Concretely, the controller 624 comprises a table which outputs control data corresponding to the predetermined transmission power and receiver signal power and a D/A converter which convert the control data to an analog control signal. The control signal from the controller 624 is supplied to the variable gain amplifiers 602,603,611,615,621 and 622 to control the gains of the variable gain amplifiers. An amplified RF signal is emitted as a radio wave from an antenna (ANT) 613 via a transmit-receive switch (T/R) 612 or duplexer.

On a receiver side, a received RF signal from the antenna 613 is input to a low-noise amplifier (LNA) 614 via the transmit-receive switch 612. The received RF signal amplified by low-noise amplifier 614 is input to an orthogonal demodulator (down converter) 618 comprising a divider and two multipliers 616 and 617 via a filter 615.

The orthogonal demodulator 618 frequency-converts the received RF signal by multiplying the received RF signal and two orthogonal local oscillation signals, and outputs the orthogonal first and the second baseband signals Ich (RX) and Qch (RX). The two orthogonal local oscillation signals are generated by dividing a local oscillation signal (frequency fLO10) of a local oscillator 619 by a 90° phase shifter (90°–PS) 620. These baseband signals Ich (RX) and Qch (RX) are amplified by baseband amplifiers 621 and 622 each comprising the variable gain amplification circuit related to the embodiment of the present invention. The amplified baseband signals Ich (RX) and Qch (RX) are input to a baseband signal processor (RX-BB) 623 and demodulated by it to be reproduced in an original data signal. Generally, the gain on the receiver is controlled by the low-noise amplifier 614 and the baseband amplifiers 621 and 622.

In a CDMA system developed in late years, when each power of transmission signals from plural users, which is of the same frequency, varies widely, right communications cannot be realized. Therefore, a transmission power control over a wide range of more than 70 dB for example is performed on a radio terminal side according to a distance from the terminal to a base station.

When the CDMA system uses radio equipment of the direct conversion system as shown in FIG. 6, a variable gain range of a RF stage variable gain amplifier arranged in an input stage of the power amplifier 611 for example is limited by an input-to-output isolation. For this reason, it is required to provide the baseband signal amplifiers 621 and 622 with a variable gain amplification function for a transmission power control.

It is desired that a lot of parts of a circuit are fabricated by MOS transistors to realize radio equipment with a low cost. The power amplifier 611, low-noise amplifier 614, orthogonal modulator 607 and orthogonal demodulator 618 and the like which belong to an analog radio circuit must be operated over a range from a low frequency to a high frequency. Therefore, these devices had better be fabricated with bipolar transistors having a good frequency characteristic is desirable.

In contrast, since the baseband signal amplifiers 602, 603, 621 and 622 treat a baseband signal of a relatively narrow band, these amplifiers may be fabricated by MOS transistors inferior to the bipolar transistor in a frequency characteristic. Therefore, a variable gain amplification circuit realized by MOS transistors as being the embodiments of the present invention is suitable for radio equipment providing the baseband signal amplifiers 602, 603, 621 and 622 with a variable gain control function.

According to the present invention, a temperature change of a gain characteristic of a variable gain amplifier using a MOS transistor can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature compensation circuit performing a temperature compensation with respect to a gain characteristic of a variable gain amplifier fabricated by MOS transistors and gain-controlled by an external gain control signal, the circuit comprising:
   a signal source which outputs a first signal corresponding to a temperature change of an ambient temperature to a predetermined temperature; and
   a multiplier which multiplies a gain control signal current corresponding to the external gain control signal and the first signal and outputs a second signal proportional to the temperature change to the variable gain amplifier,
   the signal source comprising a first MOS transistor whose source terminal is grounded, a second MOS transistor having gate and drain terminals connected to a gate of the first MOS transistor, and a resistor through which a source terminal of the second MOS transistor is grounded, and substantially identical currents flow through the drain terminals of the first and second MOS transistors, and the first and second MOS transistors operates in a weak inversion region.

2. A circuit according to claim 1, which includes an amplifier which amplifies the external gain control signal and converts it into a gain control current to be supplied to the multiplier.

3. A circuit according to claim 1, which includes a start-up circuit which drives the signal source.

4. A circuit according to claim 1, wherein the multiplier comprises a first current source which generates a tail current Io having substantially no temperature dependency, a second current source which generates a tail current Io (1+ΔT/To) having a temperature dependency, a third current source which generates a gain control current Ic before the temperature compensation, and differential MOS transistor pairs connected to the first and second current sources, respectively, and outputs a current represented by Ic(1+ΔT/To) as the second signal.

5. A circuit according to claim 4, wherein the differential MOS transistor pairs are operated in the weak inversion region.

6. A circuit according to claim 1, wherein the signal source includes a third MOS transistor connected to the gate and drain terminals of the second MOS transistor and a start-up circuit connected to a gate of the third MOS transistor to drive the signal source.

7. A circuit according to claim 1, which includes a current mirror circuit arranged between the signal source and the multiplier, the current mirror circuit comprising MOS transistors and a constant current source having substantially no temperature dependency.

8. A circuit according to claim 1, wherein the multiplier includes a constant current source having substantially no temperature dependency, the multiplier equalizing substantially a ratio between an output of the constant current source and a gain control signal current corresponding to the external gain control signal and a ratio between the first signal and the second signal.

9. A temperature compensation circuit performing a temperature compensation with respect to a gain characteristic of a variable gain amplifier fabricated by MOS transistors and gain-controlled by an external gain control signal, the circuit comprising:
   a signal source which outputs a first signal corresponding to a temperature change of an ambient to a predetermined temperature; and
   a multiplier which multiplies a gain control signal current corresponding to the external gain control signal and the first signal and outputs a second signal proportional to the temperature change to the variable gain amplifier,
   the multiplier including a constant current source having substantially no temperature dependency, the multiplier equalizing substantially a ratio between an output of the constant current source a gain control signal current corresponding to the external gain control signal and a ratio the first signal and the second signal, and
   the constant current source comprising a first current source that outputs a current proportional to thermal voltage, a second current source that outputs a current proportional to a threshold voltage of the MOS transistors, and an adder that adds the current of the first current source and the current of the second current source to generate a current having substantial no temperature dependency.

10. A circuit according to claim 9, wherein the first current source comprises a first MOS transistor whose source terminal is grounded, a second MOS transistor having gate and drain terminals connected to a gate of the first MOS transistor, and a resistor through which a source terminal of the second MOS transistor is grounded, and substantially identical currents flow through the drain terminals of the first and second MOS transistors, and the first and second MOS transistors operates in a weak inversion region.

11. A circuit according to claim 10, wherein the second current source comprises a third MOS transistor whose source terminal is grounded, a resistor through which a gate of the third MOS transistor is grounded, and a fourth MOS transistor having a gate connected to a drain of the third MOS transistor and a source grounded via the resistor.

12. A circuit according to claim 11, wherein the third MOS transistor is operated in a weak inversion region.

13. A temperature compensation circuit performing a temperature compensation respect to a gain characteristic of a variable gain amplifier, using an external gain control signal, the circuit comprising:
   a signal source which outputs a first signal corresponding to a temperature change of an ambient temperature to a predetermined temperature;
   a multiplier which multiplies a gain control signal current corresponding to the external gain control signal and the first signal and outputs a second signal proportional to the temperature change and the external gain control signal;
   a different amplifier which is supplied with the external gain control signal and outputs a third signal having substantially no temperature dependency, the differential amplifier including a source degeneration resistor; and
   an adder which adds the second signal and the third signal to output a fourth signal to the variable gain amplifier.

14. A variable gain amplification circuit, comprising:
   a variable gain amplifier fabricated by MOS transistors and gain-controlled by an external gain control signal; and
   a temperature compensation circuit which performs a temperature compensation with respect to the external gain control signal, the temperature compensation circuit including a signal source which outputs a first signal corresponding to a temperature change of an ambient temperature to a predetermined temperature, and a multiplier which multiplies a gain control signal current corresponding to the external gain control signal and the first signal and outputs a second signal proportional to the temperature change and the external gain control signal to the variable gain control amplifier, the signal source comprising a first MOS transistor whose source terminal is grounded, a second MOS transistor having gate and drain terminals connected to a gate of the first MOS transistor, and a resistor through which a source terminal of the second MOS transistor is grounded, and substantially identical currents flow through the drain terminals of the first and second MOS transistors, and the first and second MOS transistors operates in a weak inversion region.

15. A circuit according to claim 14, wherein includes a current mirror circuit arranged between the signal source and the multiplier, the current mirror circuit comprising MOS transistors and a constant current source having substantially no temperature dependency.

16. A circuit according to claim 14, wherein the multiplier includes a constant current source having substantially no temperature dependency, the multiplier equalizing substantially a ratio between an output (Io) of the constant current source and a gain control signal current corresponding to the external gain control signal and a ratio between the first signal and the second signal.

17. A circuit according to claim 16, wherein the constant current source includes a first current source that outputs a current proportional to the thermal voltage, a second current source that outputs a current proportional to a threshold voltage of the MOS transistors, and an adder configured to add the current of the first current source and the current of the second current source to generate a current having substantially no thermal dependency.

18. A radio communication apparatus comprising:

a transmitter including a baseband signal generator to generate a baseband signal, a baseband signal amplifier to amplify the baseband signal, an orthogonal modulator to orthogonal-modulate the baseband signal amplified by the amplifier, and a power amplifier to amplify a modulated signal of the orthogonal modulator; and a receiver including a low-noise amplifier to amplify a received signal, an orthogonal demodulator to orthogonal-demodulate the received signal amplified by the amplifier, a baseband signal amplifier to amplify a demodulated signal of the orthogonal demodulator, and a baseband signal processor to process the baseband signal obtained by the baseband signal amplifier of the receiver, at least one of the baseband signal amplifiers and power amplifier of the transmitter being configured by the variable gain amplifier circuit according to claim 16, and at least one of the baseband amplifiers and low-noise amplifier of the receiver being configured by the variable gain amplifier circuit.

19. A temperature compensation method of performing a temperature compensation with respect to a gain characteristic of a variable gain amplifier using an external gain control signal, the method comprising:

generating a first signal corresponding to a temperature change of an ambient temperature to a predetermined temperature; and multiplying a gain control signal current corresponding to the external gain control signal and the first signal to output a second signal proportional to the temperature change and the external gain control signal;

differential-amplifying the external gain control signal to output a third signal having substantially no temperature dependency; and adding the second signal and the third signal to output a fourth signal to the variable gain amplifier.

* * * * *